United States Patent [19]
Pascucci

[11] Patent Number: 5,731,716
[45] Date of Patent: Mar. 24, 1998

[54] PROGRAMMABLE MULTIBIT REGISTER FOR COINCIDENCE AND JUMP OPERATIONS AND COINCIDENCE FUSE CELL

[75] Inventor: Luigi Pascucci, Sesto S. Giovanni, Italy

[73] Assignee: SGS-Thomson Microelectronics, S.r.l., Agrate Brianza, Italy

[21] Appl. No.: 592,122

[22] Filed: Jan. 26, 1996

[30] Foreign Application Priority Data

Jan. 26, 1995 [EP] European Pat. Off. ............ 95830020

[51] Int. Cl.⁶ .................................................. H03K 19/177
[52] U.S. Cl. ......................... 326/106; 326/13; 326/37; 365/200
[58] Field of Search ................... 326/10, 13, 37, 326/39, 106; 365/104, 200

[56] References Cited

U.S. PATENT DOCUMENTS

| | | | |
|---|---|---|---|
| 4,672,240 | 6/1987 | Smith et al. | 326/10 X |
| 4,791,319 | 12/1988 | Tagami et al. | 326/13 |
| 5,559,743 | 9/1996 | Pascucci et al. | 365/200 |
| 5,561,621 | 10/1996 | Devin et al. | 365/200 X |

FOREIGN PATENT DOCUMENTS 0058049  8/1982  European Pat. Off. .

OTHER PUBLICATIONS

IBM Technical Disclosure Bulletin, vol. 17, No. 10, Mar. 1975, New York, pp. 2897–2899 S. Dasgupta, "Array logic structure using FAMOS devices".

Patent Abstracts of Japan, vol. 18, No. 216 (P-1728), Apr. 1994, & JP-A-06 021884 (NEC Corp.), Jan. 1994.

*Primary Examiner*—David R. Hudspeth
*Attorney, Agent, or Firm*—Robert Groover; Betty Formby; Matthew Anderson

[57] ABSTRACT

A programmable cell and a multibit register composed of a plurality of such cells, specifically for performing a coincidence check between a certain code permanently recorded in the cell or cells and a logic configuration present on a pair or on a plurality of pairs of control lines are disclosed. Each cell has two branches connected in OR configuration to a common sensing line of the cell or of the multibit register. The logic states to be tested for coincidence are applied in a complemented form through a pair of lines to each cell, that is to the two branches of the cell. Each cell, permanently programmed in one or the other of its branches, intrinsically performs a comparison between its permanently programmed logic configuration and the configuration of the complemented control lines associated therewith. A great simplification is achieved in the overall circuitry of a redundance or reconfiguration system.

8 Claims, 5 Drawing Sheets

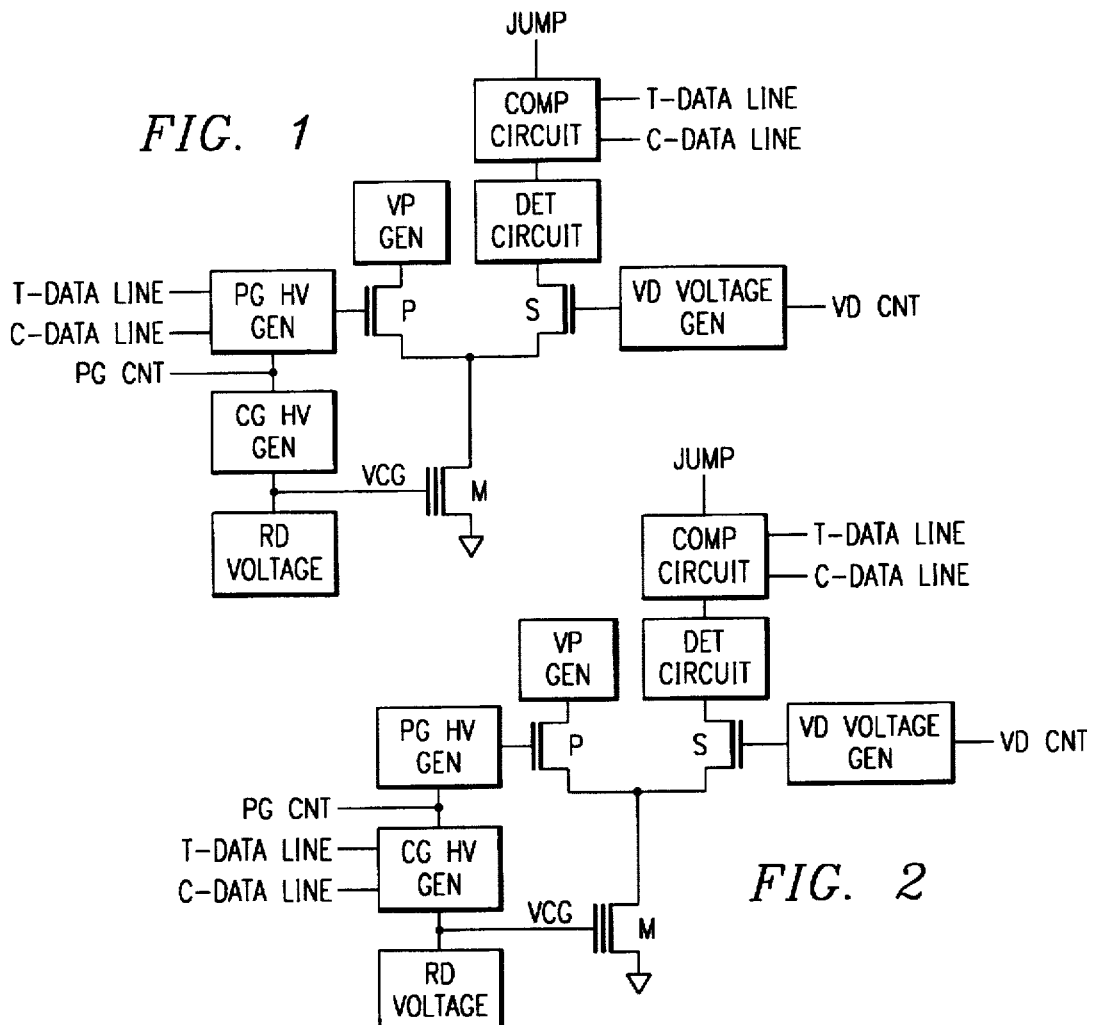
FIG. 1
FIG. 2
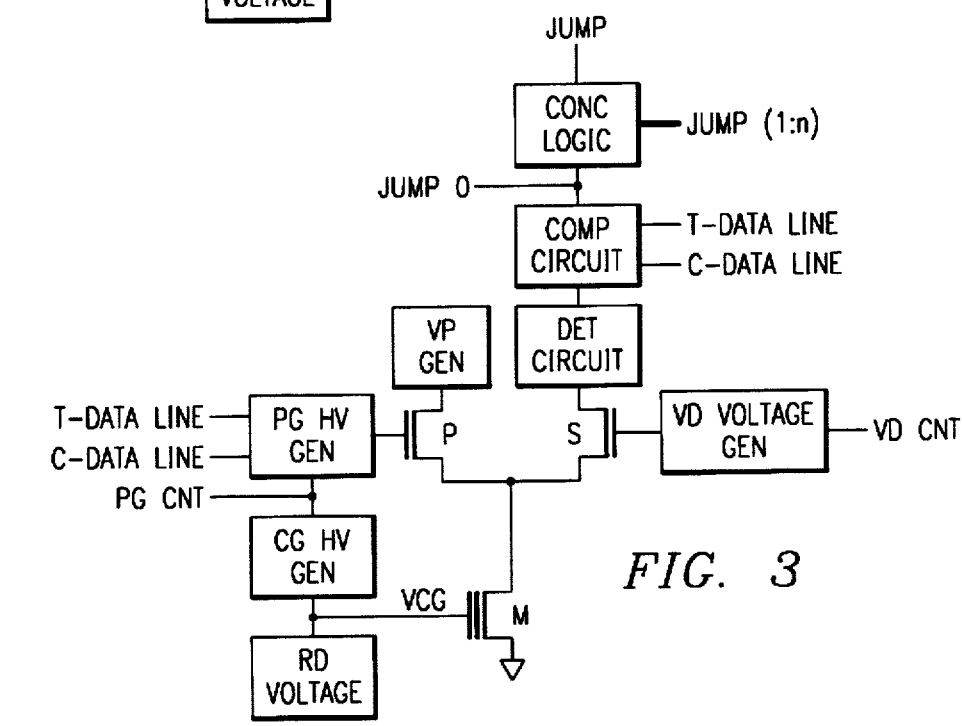
FIG. 3

PROGRAMMABLE MULTIBIT REGISTER FOR COINCIDENCE AND JUMP OPERATIONS AND COINCIDENCE FUSE CELL

CROSS-REFERENCE TO RELATED APPLICATION

This application claims priority from EP 95830020.4, filed Jan. 26, 1995, which is hereby incorporated by reference.

BACKGROUND AND SUMMARY OF THE INVENTION

The present invention relates in general to logic coding circuits for implementing redundancy systems, substituting circuit blocks, modifying a data flow through a circuitry or changing the functions performed by a certain integrated circuit.

Concurrently with the development of integration technologies that allow to "compact" in single chip ever more complex and/or diversified systems, eventually with the ability of being subsequently adapted to particular specifications of users, a need has arisen for implementing in the same integrated circuit redundancy systems and/or special circuits that though a programming performed on the finished device, permit to replace and/or modify particular functions of certain integrated circuits and/or modifying the circuit flows. These redundancy, configuration/reconfiguration facilities permit to recover an appropriate performance of the integrated device, fully meeting the specs after detection of a defect of an intervening failure of a circuit component, thus preventing the often non-negligible economic loss of discarding the whole device. Of course, these configuration reconfiguration circuits may also allow to adapt a certain device to particular requirements of the user, thus making possible a great saving in terms of design and fabrication of devices covering diversified requirements. Complex optimization evaluations of the design of new devices, take into consideration statistical data pertaining to the particular fabrication process in order to determine an optimum cost/benefit ratio in defining the total number of these redundancy/configuration/reconfiguration circuits to be implemented in a certain integrated device. The cost being represented by the silicon area to be destined to these circuits. A typical application of these circuits is represented by the redundancy systems of read only memory arrays. It is evident that for fabricating memory devices with ever increasing capacities (for example 16 Mbit memory devices), it would be an intolerable economic hazard to be obliged to discard the device because of the failure or erratic performance of a single bit. In these, as well as in an innumerable similar situations, it is mandatory from an economic point of view, to design and implement in the same device, a certain number of spare bitlines and wordlines to be used (to be addressed) in substitution of one or more bitlines or wordlines found to be defective by a dedicated control circuitry and therefore substitute them with an equal number of spare (redundant) lines.

In order to implement a redundancy system, a dedicated circuitry capable of identifying a certain event (failure) occurring in a certain location (bit) of a data (word) recordable in a certain location of a memory array, becomes necessary in order to be able to substitute the false bit with a spare bit (cell) that is with a redundancy cell. Commonly recognition of a certain event (failure) occurring in a certain location (bit) commonly is implemented by generating codes capable of unequivocally identifying the failed bit. For example, in case of a memory cell array, read by words of eight bits each (that is having a so-called read parallelism of eight bits), the coding of such a read parallelism requires three bits, because three bits permit to number (identify) from 1 to 7. Besides the coding circuitry, that is the circuitry capable of generating identification codes of a certain event of failure, an addressing circuitry is also needed. This second circuit section may represent the more burdensome part of the additional circuitry that is necessary to implement the redundance system. In other words, these circuits may require the largest portion of additional silicon area for implementing the system. Moreover, because these circuits must compare configurations (codes) and subsequently must process the results of the comparison for implementing an eventual re-addressing, tree-type logic circuits (that is several levels of logic gates in cascade) are often needed. Notably these multi level logic circuits may introduce delay or dead-times in the propagation of signals through the functional circuits of the memory array.

According to a widely used technique for recognizing a certain condition and eventually causing a jump or change of direction operation, programmable logic circuits are commonly employed. In case such a circuit uses one or more programmable nonvolatile memory devices (that is a structure commonly referred to as a "fuse"), each programmable circuit (that is each fuse cell) has its own read circuit associated therewith. Moreover, a bit-to-bit comparator is commonly associated to each fuse cell. A coincidence verifying logic circuitry having a number of levels adequate to the number of jump signals to be handled, completes the functional scheme of a typical control circuitry of redundance system.

The schemes of FIGS. 1 and 2 show the architecture of a fuse cell for recognizing a condition to which a jump operation must be associated, according to two alternative known embodiments.

The programmable jump fuse contains at least a nonvolatile memory element M which may be for example a FLASH-EPROM or EEPROM cell, a programming transistor P, a select transistor S, a read circuit DET CIRCUIT, a comparator COMP CIRCUIT, a circuit for generating a programming bias voltage VP GEN, a circuit for generating a high programming voltage PG HV GEN, a circuit for generating an appropriate high voltage bias CG HV GEN for the control gate of the nonvolatile memory element M during programming, a circuit for generating a biasing voltage RD VOLTAGE for reading the programmable jump fuse. Typically, the control is implemented through two complementary signal lines T-DATA and C-DATA LINE and by the control lines for programming and selection: PG cnt and VD cnt, respectively.

Of course, in case of control systems that must recognize multiple jump conditions, it is common practice to compose multibit registers employing the required number of cells or fuses as the one schematically depicted in FIGS. 1 and 2, and by implementing an adequate logic circuit for verifying coincidence, capable of decoding the jump signals eventually produced by an n number of programmable jump fuses, that is capable of comparing the coincidence between the logic configuration of a multibit control register with a certain code. Systems employing multibit registers composed of fuse cells according to the schemes of FIGS. 1 and 2, are depicted in FIGS. 3 and 4, respectively. The coincidence circuitry is schematized by a block CONC LOGIC, to which the jump signals generated by an n number of cells (bits) are fed.

As may be observed, each cell (bit) of the register contains both its own read circuit (DET CIRCUIT) as well as a comparator circuit (COMP CIRCUIT), which therefore are modularly repeated n times.

A typical core circuit of a cell is schematically shown in FIG. 5, where the comparator circuit is represented by the block COMP CIRCUIT, which in turns, may have a circuit as the one shown in FIG. 6.

With a cell circuit as shown in FIG. 5, based on the use of a pair of nonvolatile memory elements M1 and M2, the need of excluding the recognition of a condition that can be associated to a jump operation in case both memory elements M1 and M2 be left virgin, may require an additional switch, which may be represented by the TEST input of the circuit of FIG. 5, in order to preliminarily be able to exclude from logic elaboration those cells that appear to produce an "anomalous" current level. Alternatively, in the case of a fuse cell with a dual structure, that is employing at least two memory elements, one for each branch thereof and to which branches the complementary signals ADDRT and ADDRN are applied as shown in FIG. 5, the two nonvolatile memory elements MI and M2 cannot be left both in a virgin state, because such a condition could otherwise be interpreted as an indication of a condition associated to a jump operation, irrespectively of the complementary signals ADDRT and ADDRN.

Therefore, when configuring the integrated circuit, the resources (fuse cells) that are not materially employed in implementing a certain redundance or like system, must be programmed (that is one of the memory elements M1 and M2 must be placed in an OFF condition) in order to eliminate unnecessary consumption. This exclude the possibility of further modifying the flow at a later stage.

Clearly a substantial circuit complexity emerges from the schemes of FIGS. 3, 4, 5 and 6 and from the above observations. This implies a relatively large area requirement, that is a relatively high cost.

There is therefore the need and/or utility for a programmable register capable of implementing a function of recognition of a condition to which a jump operation should be associated, which has a simplified architecture and employs a single read circuit for all the programmable cells (fuses) that form the register.

In this area, there is also the necessity and utility for a programmable cell or fuse capable of intrinsically performing the necessary comparison for establishing a jump condition without requiring a specific comparator associated therewith and which permits therefore a decisive circuit simplification as compared with that of a fuse cell for jump operations made according to the prior art.

These and other objectives that will be identified in the course of the following description are met by the present invention that provides numerous important advantages as compared with the known architectures, as will be illustrated hereinbelow.

Basically, a programmable register for implementing jump operations (programmable jump register) of the invention is based on the use of one or more unit cells, each intrinsically containing an information relative to the result of a comparison between logic values present on respective control lines and a prearranged programmed configuration of each single cell.

Essentially, each register comprises a single reading circuit, an input of which is represented by a single common sensing line to which are connected in an OR configuration all the cells that compose a multibit register. The read or sense amplifier circuit may employ any suitable reference system among the various known systems. The so-called unbalanced load reference system, the reference system employing a generator of half the current flowing through a virgin memory element, or a current double the current of a virgin cell, according to a common techniques used in sense amplifiers of memory arrays may be used in the reading circuit of a register of the invention.

Each incoming information relative to the generation of a jump signal is present in a complemented form in the register and in such a complemented form is applied to a certain fuse cell of the register.

Each fuse cell of the register is activated as a whole but only one of the two sections of the cell is "selected" through the pair of complemented lines, depending on the pair of complementary signals acting on the respective select transistors of the two sections or branches of the cell.

Being all the cells connected in an OR configuration to a single sensing line, a selection encompassing at least a cell, that is a conductive section or branch of the dual branches of a cell, produces at the output of the sense amplifier state opposite to a condition wherein no one cell that is no one branch of cell be conductive.

Each cell may have both branches or sections or only one of them conductive. In practice, if the cell is programmed (made permanently nonconductive ) on both dual sections thereof, the cell is in fact excluded and an eventual condition of jump that may occur on a certain pair of complementary control signals (lines) may be "captured" only by the remaining cells of the register. In practice this means lowering the degree of coincidence (that is the number of combinations) to be verified. This, though not always being allowed, may be useful in particular applications, as will be described later.

Conversely, even if only one of the cells is left completely virgin (maintained in a state of conductivity of both its sections), such a cell will "mask" the comparison performed by any other or all the other cells of the register.

In practice, all the dual branch cells that compose the register are originally virgin (conductive) in both sections or branches and a normal setting of the register for using the device contemplates that each cell be left completely virgin (both sections virgin) or that one or the other section of each cell be programmed (that is made permanently nonconductive), leaving the other section virgin (that is conductive). The programming is performed collectively and commonly produces a modification of one or of the other of the two sections or branches of each cell that composes the register, that is the branch or section that at the programming instant has the drain of the respective programming transistor at a high logic level "1".

By considering each cell as composed of two dual branches, each of which may be programmed in a conductive or nonconductive state, connected in OR configuration to the unique sensing line of the register, when both branches of all the cells are virgin (conductive), the register is in a state of inability of detecting (catch) a jump event. Therefore, its output state will be such as not to produce in any case a coincidence event that may promote a jump or re-addressing operation by a dedicated decoding circuitry, for example in the case of a redundance system.

Conversely, if for a certain configuration of the complemented control lines, all the cells of the register have both their respective sections nonconductive, no current will flow in the common sensing line of the register. The register will be recognized as operative and therefore its output state will be able to produce a coincidence event that will promote a jump or a readdressing operation by part of the dedicated decoding circuitry.

Consistently with this, if only one cell of the register is programmed on both its sections, the complemented control lines associated to the two sections of such a cell will not produce an effect in any case. In other words, the particular cell so programmed will concur, but always in an "affirmative" mode, to the identification of a jump condition by the register.

This ability of being able to "exclude" from performing a comparison a specific cell of the register (by programming both branches thereof, that is by making them permanently nonconductive) may be useful in all those cases wherein consecutive jumps must be performed, that is for redounding consecutive bits without engaging or using several registers for the purpose.

Conversely, even if a single cell of the register is left with both branches in a virgin state (conductive) irrespectively of the configuration of the complemented control lines associated therewith, the current that the cell produces on the common sensing line of the register will determine a block or exclusion of the register itself. In other words, the register will never assume an output state capable of determining a coincidence event that may in turn promote a jump operation.

The advantages that derive from a register structure as synthesized above are a great reduction of the area requirement, the possibility of implementing redefined jump points, a simplification of the circuits and a reduction of consumption. The management of the register itself is particularly simplified because firstly each register is intrinsically manufactured in a state of "self exclusion" (no possibility of causing a jump operation) because all the cells that compose it are conductive along both branches (virgin). Therefore if a resource (register) does not need to be used, it isn't necessary to intervene for excluding it by an appropriate programming. Moreover, it is no longer necessary to arrange particular test modes for making the system's currents null.

A register made according to the present invention can be realized in a large number of alternative circuit arrangements of single programmable cells (fuses), that can be "interrogated" through a complemented pair of control lines (signals), each acting on one of the two dual branches of the cell that are connected in OR configuration to a common sensing line of the register. For example, each cell (or fuse) may be realized with a bistable circuit, for example a flip-flop, the state of which may be programmed by the use of a nonvolatile memory devices in the flip-flop circuit, or by complementing on the two branches of the cell a certain logic state that can be permanently stored in a nonvolatile manner on a single memory element.

An outstandingly simple and effective circuit structure for a unit cell or fuse has been found and represents an important aspect of the present invention. The programmable cell is perfectly able to detect conditions of jump and is remarkably suited for realizing multibit registers according to the present invention.

Basically, the elementary programmable cell of the invention is capable of providing an information corresponding to the result of a comparison between two logic configurations for eventually producing a jump operation. The cell is composed of two sections or branches perfectly identical to each other (dual), connected in OR configuration to a common sensing node of the cell.

Each section comprises at least a select transistor, at least a programming transistor and one or more transistors capable of being programmed in a nonvolatile manner (for example a floating gate transistor). The gate of the select transistor and the drain of the programming transistor of one section or branch may be connected in common to a respective control line of a pair of complementary control lines for the two sections of the cell. Alternatively, the above mentioned nodes may not be connected in common; on the contrary each control line may be connected to one of the two nodes in a section of the cell and to the other node in the other section of cell, that is in a cross-coupled arrangement with said nodes.

The possible configurations of the fuse cell of the invention are the following.

When both sections of the cell are virgin (both branches conductive), no comparison with the complementary logic values of the pair of control lines is activated or possible, therefore the cell will provide a "false" comparison information on each section.

When the two sections of the cell are made dishomogeneous by programming one or the other (making nonconductive one or the other branch of the cell), the cell has the ability to perform a comparison. The information rendered by the cell will be of negative comparison in the section or branch of the cell that comprises a virgin cell (nonprogrammed cell) and of a positive comparison in the section or branch of the cell comprising a programmed cell.

Even if is generally a not used or allowed condition, in case the programmable elements of the branches or sections of the cell are both programmed (made permanently nonconductive), an eventual comparison, if forced, would always render a positive result.

Therefore, the programmable cell (fuse) of the invention is capable of producing on a common sensing node an information corresponding to the result of a comparison, without requiring the realization of a dedicated comparator. In other words, in function of the programmed or nonprogrammed state of the nonvolatile memory elements that are present on one and on the other of the two dual branches of the cell, the latter is capable of producing on a common sensing node to which the two branches are connected in an OR configuration, the result of a comparison carried out with a certain data (bit) which is applied to the cell in a complemented form through two respective complementary control lines which act upon respective select transistors. The cell as fabricated is intentionally actionable for performing a comparison by programming the nonvolatile memory element of one or the other of the two dual branches of the cell.

These basic functions are implemented with an extremely simple circuit which requires a relatively small area of integration.

BRIEF DESCRIPTION OF THE DRAWING

The disclosed inventions will be described with reference to the accompanying drawings, which show important sample embodiments of the invention and which are incorporated in the specification hereof by reference, wherein:

FIGS. 1 and 2 are alternative schemes of a programmable cell for performing a comparison to identify a jump condition, according to a known technique;

FIGS. 3 and 4 schematically show the organization of an n number of cells for constituting a multibit programmable register for detecting a jump condition in the configuration of a plurality of control lines, by employing known structures of FIGS. 1 and 2;

DETAILED DESCRIPTION OF THE PREFERRED EMBODIMENTS

Figure 4:
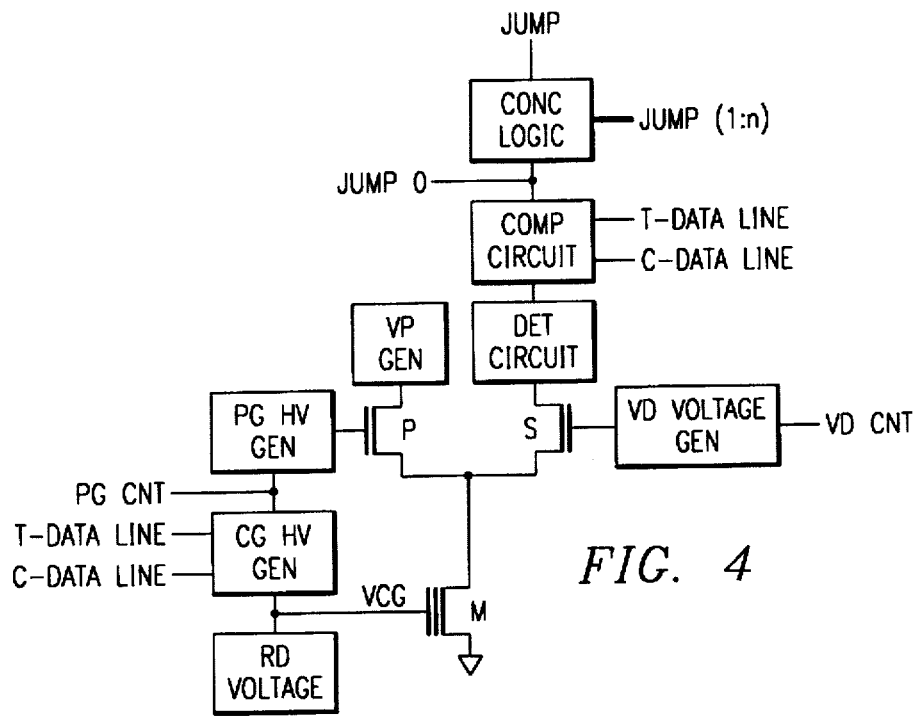
Figure 5:
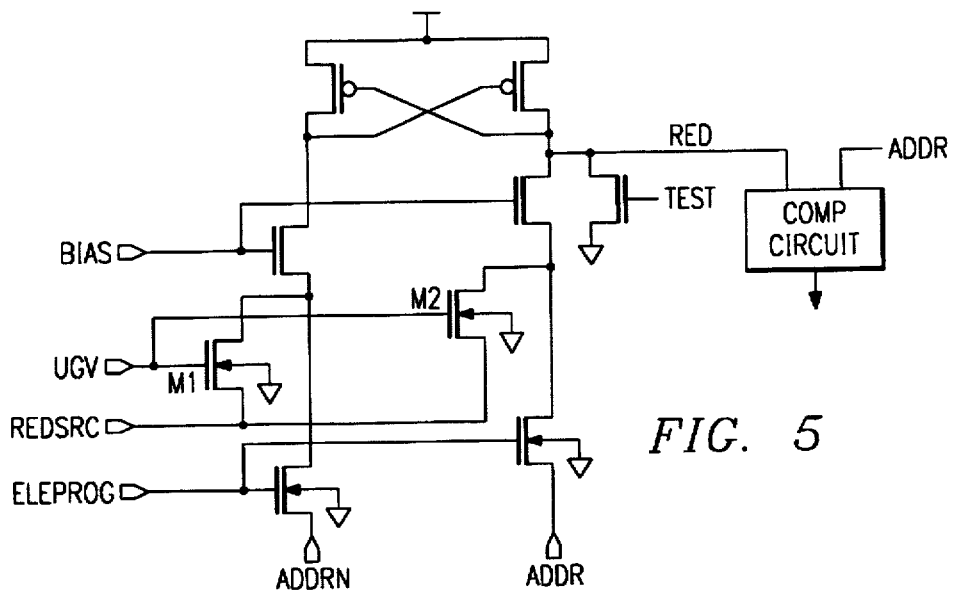
FIG. 5 is a circuit diagram of a programmable cell according of a known architecture.
Figure 6:
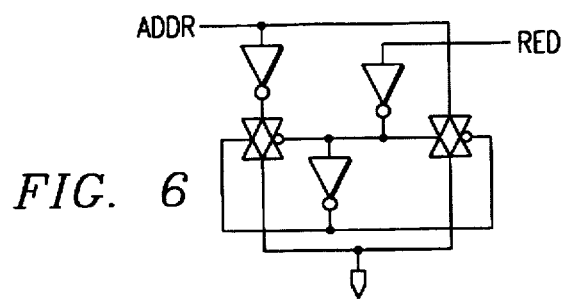
FIG. 6 shows the circuit diagram of a comparator associated to each programmable cell, according to a known architecture.
Figure 7:
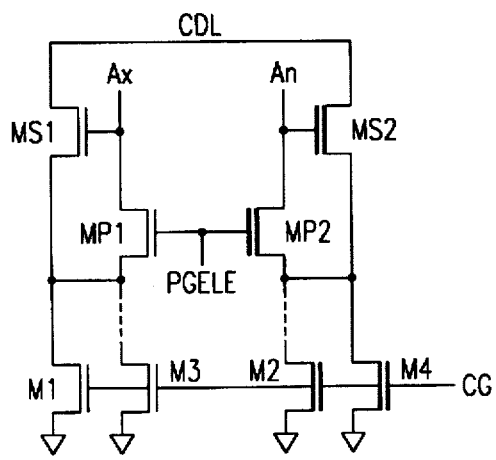
FIGS. 7 and 8 are alternative embodiments of a programmable cell according to the present invention.
Figure 8:
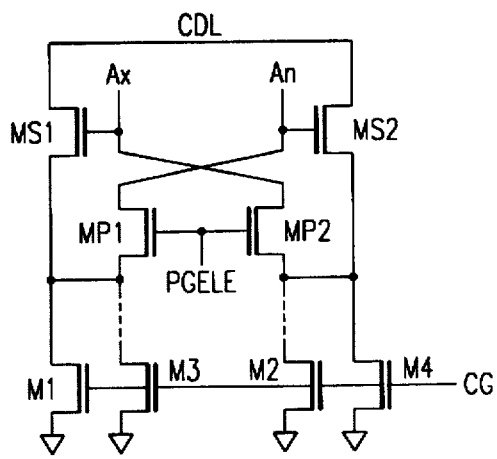

The numerous innovative teachings of the present application will be described with particular reference to the presently preferred embodiment (by way of example, and not of limitation), in which:

With reference to the diagrams of FIGS. 7 and 8, a comparison fuse cell for identifying a jump condition according to the present invention may comprise at least a pair or more pairs of nonvolatile memory elements, for example FLASH-EPROM or EEPROM cells, M1 and M2 and, in ease a double pair of cells is used, also M3 and M4, as shown in the figures. The nonvolatile memory elements, M1, M2 and eventually also M3, M4 of each fuse cell are controlled through a control gate line CG.

Schematically, each elementary fuse cell is composed by two completely identical sections or branches connected in an OR configuration to the common sensing node CDL (Current Detect Line). Each section comprises (in a perfectly dual manner) a select transistor Ms1 (Ms2), a programming transistor Mp1 (Mp2) and each branch may contain one or more nonvolatile memory cells, functionally connected in parallel (two cells for each branch in the examples shown).

The two control lines Ax and An have complementary logic levels during normal operation.

The two programming transistors may be controlled in common through the line PGele.

As shown in FIG. 7, the control gate of the select transistor Ms1 (Ms2) and the drain of the programming transistor Mp1 (Mp2) of each branch of the cell may be connected in common to the same control line Ax (An). Conversely, in the example shown in FIG. 8, these connections are crossed for the two sections or branches of the cell. In purely functional terms, the two circuit solutions are essentially alternative. The solution of FIG. 8 may be more advantageous under certain conditions because it permits to safely set to ground potential the common reading line (CDL), whenever the occurrence of spurious current paths cannot be excluded. This is possible because the common reading line (CDL) remains substantially isolated from the memory devices and therefore may be switched to ground without problems.

Figure 9:
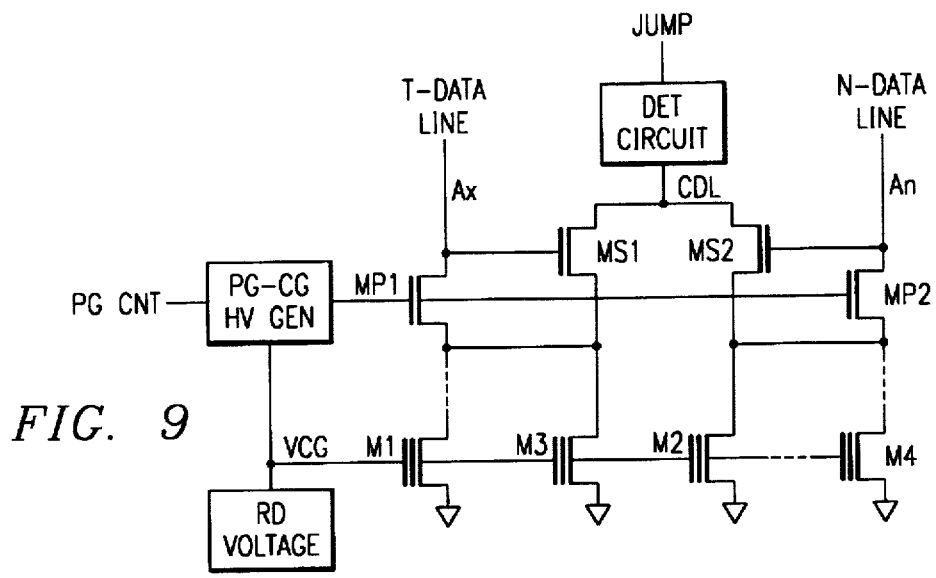
FIG. 9 shows a functional scheme of a programmable cell of the invention suitable for generating a signal of recognition of a jump condition.

A complete functional scheme of a fuse cell according to the present invention is shown in FIG. 9.

The block PG-CG HV GEN represents a circuit suitable to generate the programming voltage or voltages to be applied to the control gate (Vcg) of the memory elements M1,M2, M3,M4 and for activating the programming transistors Mp1 and Mp2 in function of a programming command PG cnt.

The block RD VOLTAGE represents a circuit suitable to generate an appropriate biasing voltage during a reading phase of the fuse cell, which may be applied to the common control gate line of the nonvolatile memory elements M1, M3 and M2, M4. The block DET CIRCUIT schematically indicates a reading circuit or sense amplifier capable of determining the presence of a current on the common reading line CDL to which are connected in OR configuration the two branches of the fuse cell. The cell may be addressed to a pair of control lines Ax and An. The same control lines Ax and An may be used for applying the appropriate voltages during a programming phase of the fuse cell.

During normal operation of the cell, on the two control lines Ax and An complementary logic levels are present, namely: T-DATA LINE (true data line) and N DATA LINE (complemented data line).

Normally, the nonvolatile memory elements of one or the other branch of a fuse cell of the invention, are programmed in order to make permanently nonconductive one of the two branches of the cell. Therefore, on the common sensing line CDL of the cell current may exist only for one of the two possible configurations of the two control lines T-DATA LINE and N-DATA LINE. The result of the comparison will be expressed as positive or negative by the output state of the reading circuit DET CIRCUIT (jump signal output line).

In case both branches of the fuse cell are left virgin (conductive) there will be always a current through the CDL line during a reading phase, because one or the other of the control lines will be at a logic level "1" so as to make conductive the relative select transistor Ms1-Ms2. This will determine a logic state "0" at the output of the reading circuit, in practice automatically excluding the fuse cell or in other words inhibiting its ability to generate a jump operation.

The other condition whereby both branches of the fuse cell of the invention are made permanently nonconductive by programming the respective nonvolatile memory elements M1,M3, M2,M4, is a condition that generally is not useful because the cell would always generate a jump signal every time reading thereof is forced. On the other hand, even such a programmed state of the fuse cell of the invention may become useful in particular situations, as will emerge further on this description.

Figure 10:
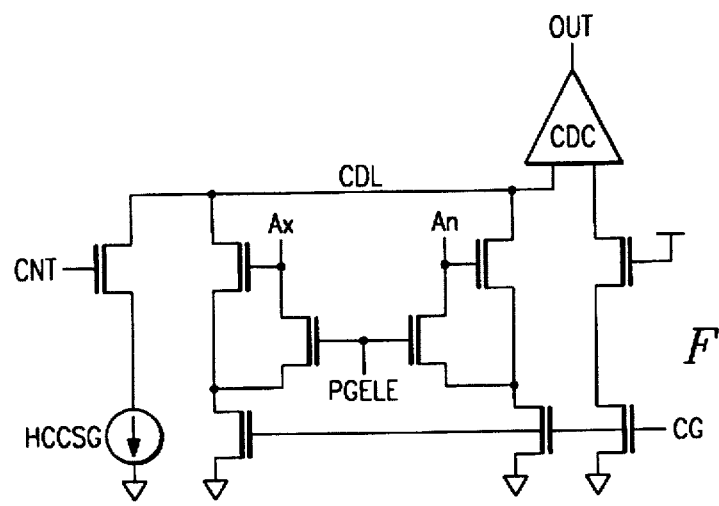
FIGS. 10, 11 and 12 show different embodiments of a programmable cell of the invention for different sensing techniques.
Figure 12:
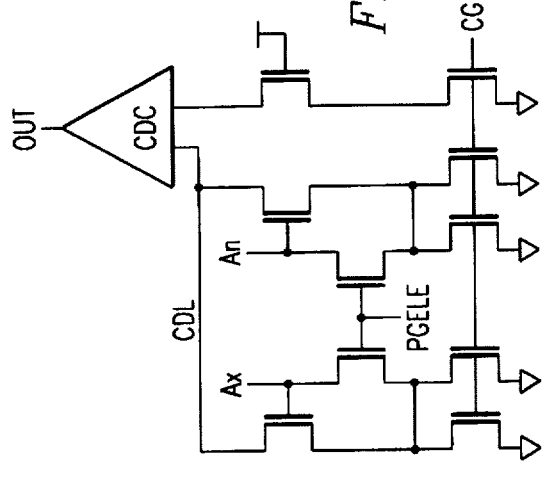
Figure 11:
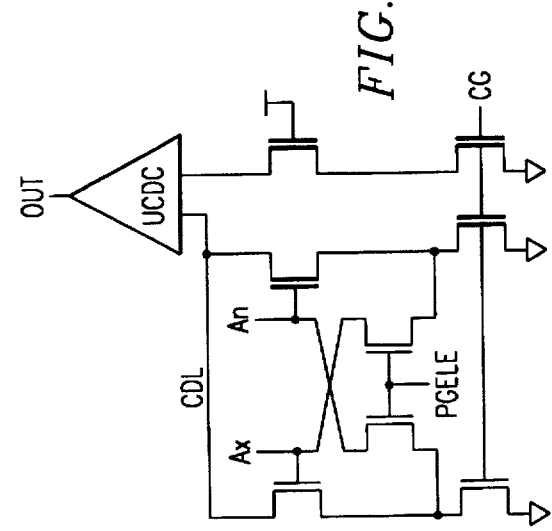

FIGS. 10, 11 and 12 show programmable jump fuses of the invention made according to alternative embodiments, as already described in relation to FIGS. 7 and 8, complete with sensing circuit according to different techniques for detecting the presence of a current in the common reading line CDL of the two dual branches of the cell.

A fuse cell of the invention is useful in a large number of applications, in particular a programmable "jump fuse" of the invention may be used for implementing:

programmable enabling of circuit parts;
programmable disabling of circuits parts;
programmable options in performing certain data processing.

Figure 13:
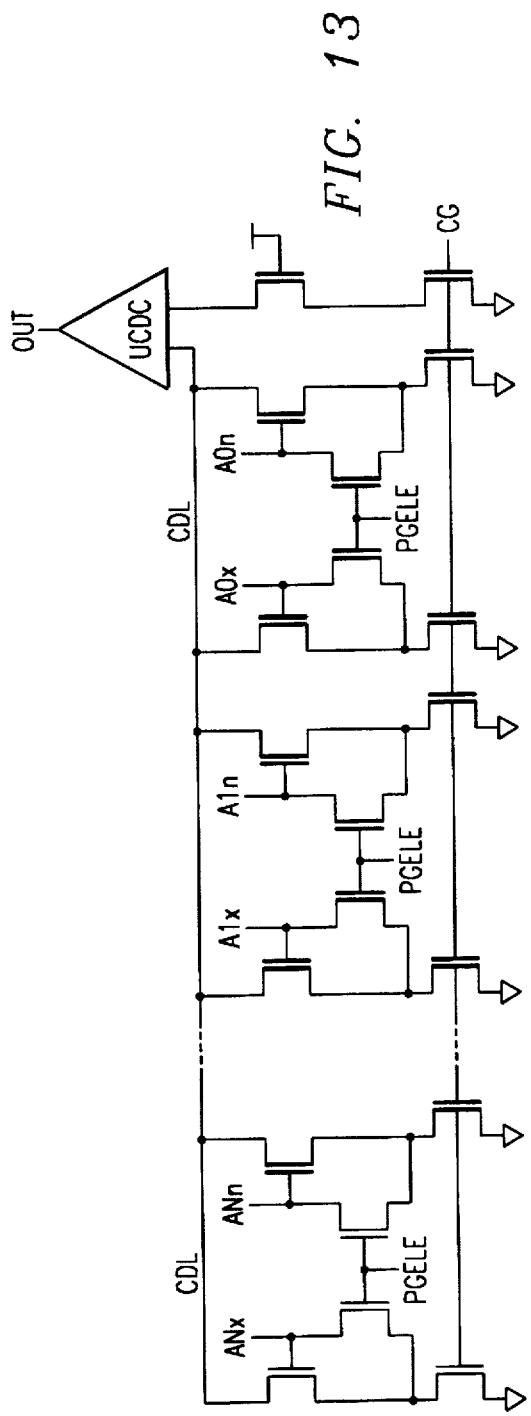
FIGS. 13, 14 and 15 show multibit programmable registers for recognizing a jump condition over a plurality of control lines, according to the present invention.
Figure 14:
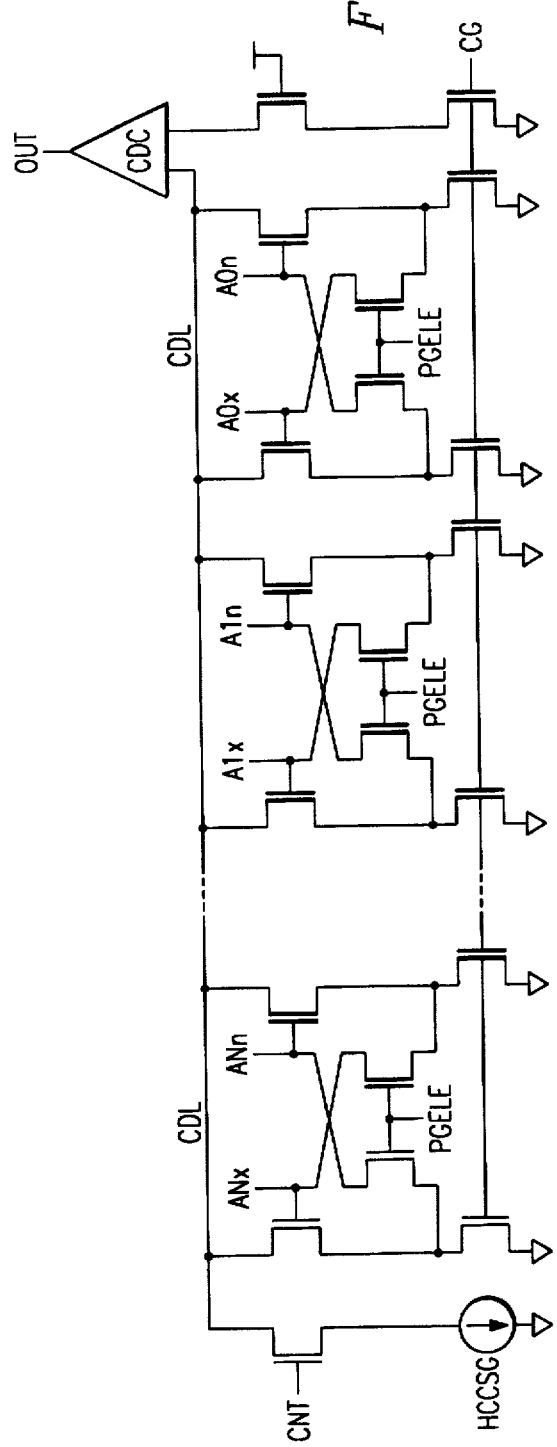
Figure 15:
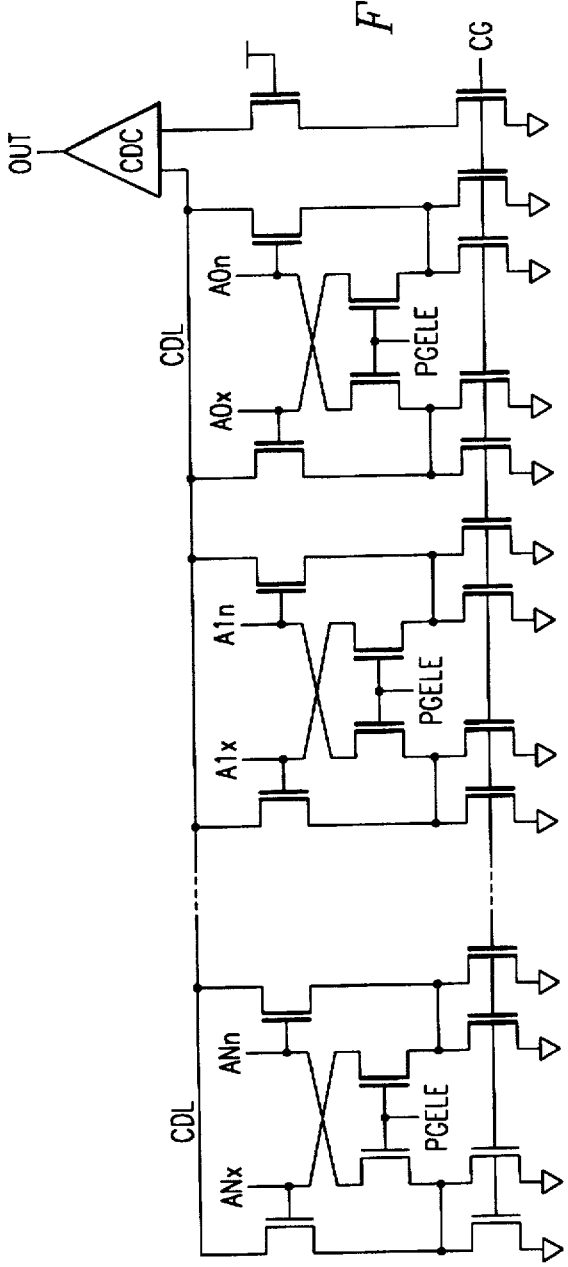

Programmable multibit registers for detecting conditions to which a jump operation is associated, that is capable of detecting a jump condition over a plurality (0/:N) of lines (that is of a plurality of pairs of complemented data lines according to the present invention) are shown in various alternative embodiments in FIGS. 13, 14 and 15.

Independently of the choice of the type of unitary reading circuit for the entire multibit register, each signal carrying an information relative to the signaling of an eventually required jump operation is present in a complemented form and in such a form is applied to a respective programmable fuse cell of the register, through a pair of control lines Akx and Akn, where k is comprised between 0/ and N.

Normally, each cell (fuse) of the multibit register will be permanently programmed in one or the other section thereof, by programming a single or plural nonvolatile memory elements functionally connected in the particular branch of the cell. In these conditions, the cell is capable of recognizing a jump condition signal coming through the respective complementary control lines and eventually generates a current in the common sensing line CDL of the register to which are connected in OR configuration all the fuse cells of the multibit register, in function of the configuration of the complementary logic states of the control lines Akx and Akn associated therewith.

In case one or more fuse cells of the transistor are prearranged with both branches programmed (made permanently nonconductive) the cell or the cells thus preconditioned are in practice excluded from the possibility of contributing to the detection of an eventual jump condition, which will be eventually detectable by other cells of the register.

The case wherein at least one of the fuse cells that form the multibit register is deliberately left with both branches virgin (conductive) may also be contemplated in a normal use of the multibit register. Such a preconditioning will mask the result of any comparison that may be performed by other fuse cells of the register. Consequently, a coincidence event (positive comparison) that may promote the generation by the sense circuit of a signal that may cause a jump operation will never be verified.

In case, with a certain configuration of the control lines a situation occurs such that all the cells of the register are in a condition of having both branches nonconductive, no current will flow through the common sensing line CDL. The register (the particular resource) will therefore result exploited and sense amplifier will produce an output signal capable of promoting a jump (readdress) operation.

From the outstandingly circuit simplicity of each programmable fuse cell of the invention as well as from the possibility of employing a single reading circuit for a whole multibit register, an outstanding overall simplification of the circuits is achieved which has a marked effect on reducing the area requirement for the entire redundance or configuration/reconfiguration system.

Another advantage may be recognized in an attendant reduction of the current consumption, implicit in the minimization of the number of sensing circuits.

The management of the system is also simplified. Firstly each resource (register) is fabricated intrinsically in a blocked condition and therefore, whenever a particular resource is not to be used, it is no longer necessary to proceed with a preconditioning thereof by programming.

Moreover, is no longer necessary to contemplate particular test modes for making null the system's currents.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A programmable cell for a comparison or coincidence function between a certain logic signal and a permanently recorded logic value, comprising:

first and second identical sections connected in an OR configuration to a common sensing line of the cell;

each said section comprising a select transistor and at least one FLASH EPROM, functionally connected in series between said common sensing line and a common potential node, and a programming transistor;

each said select transistor having a gate connected to one of a pair of control lines through which said logic signal is applied to the cell in a complemented form;

said common sensing line assuming a state representative of the result of a comparison between the complementary logic states of said pair of control lines and a prearranged configuration set by programming said FLASH EPROM of one or the other of said two sections of the cell, said common sensing line assuming a deselected state when said FLASH EPROMs are both virgin.

2. The programmable cell of claim 1, wherein the drain of one or of the other of said programming transistors of said two sections of the cell is connected to one or to the other of said control lines.

3. The programmable cell of claim 1, wherein said FLASH EPROMs have a common control gate.

4. The programmable cell of claim 2, wherein said programming transistors have a gate connected in common to a programming control line.

5. A programmable cell for a comparison or coincidence function between a certain logic signal and a permanently recorded logic value, comprising:

first and second identical sections connected in an OR configuration to a common sensing line of the cell;

each said section comprising a select transistor and at least one nonvolatile memory element, functionally connected in series between said common sensing line and a common potential node, and a programming transistor;

each said select transistor having a gate connected to one of a pair of control lines through which said logic signal is applied to the cell in a complemented form;

said common sensing line assuming a state representative of the result of a comparison between the complementary logic states of said pair of control lines and a prearranged configuration set by programming said nonvolatile memory elements of one or the other of said two sections of the cell;

further comprising a reading circuit means capable of detecting the presence of a current flowing through at least a section of the cell.

6. A programmable multibit register for outputting a logic signal representative of a verified coincidence or noncoincidence among a configuration of a plurality of complementary pairs of logic signals present on a plurality of pairs of control lines and a certain multibit code recorded in a nonvolatile manner in the register, comprising a plurality of FLASH EPROM cells programmable in a nonvolatile manner, each having dual sections or branches each functionally connected to one of said pair of control lines, characterized in that said dual branches or sections of all said programmable cells are connected in an OR configuration to a common sensing line of the register;

each branch or section comprises at least a select transistor having a gate connected to one of a respective pair of control lines and at least a nonvolatile programmable device capable of making permanently nonconductive the relative branch of the cell if programmed or to permit the flow of current if nonprogrammed;

said common sensing line constituting an input node of a single sense amplifier of the register, said common sensing line assuming a deselected state when said FLASH EPROMs are both virgin.

7. A programmable multibit register as defined in claim 6, wherein each of said dual branches or sections of said programmable cells that compose the register comprises also a programming transistor having a drain connected to one or the other of the respective pair of control lines of the cell, a source connected to a current terminal of said nonvolatile programmable device and a gate connected in common with the gate of the programming transistor of the other branch or section of cell to a programming control line.

8. A programmable multibit register as defined in claim 6, comprising a single reading circuit capable of detecting the presence of a current through said common sensing line of the register and to generate an output logic signal representative of a coincidence or noncoincidence between the configuration of said complementary logic values present on said pairs of control lines and a multibit code recorded in a nonvolatile manner in the cells that compose the register.

* * * * *